United States Patent [19]
Fraas et al.

[11] Patent Number: 5,512,109
[45] Date of Patent: Apr. 30, 1996

[54] GENERATOR WITH THERMOPHOTOVOLTAIC CELLS AND HYDROCARBON BURNER

[75] Inventors: Lewis M. Fraas, Issaquah; Michael R. Seal; Edward M. West, both of Bellingham, all of Wash.

[73] Assignee: JX Crystals, Inc., Issaquah, Wash.

[21] Appl. No.: 393,919

[22] Filed: Feb. 24, 1995

Related U.S. Application Data

[63] Continuation-in-part of Ser. No. 260,910, Jun. 15, 1994, Pat. No. 5,439,532, which is a continuation-in-part of Ser. No. 47,477, Apr. 19, 1993, Pat. No. 5,383,976, and Ser. No. 906,452, Jun. 30, 1992, Pat. No. 5,312,521.

[51] Int. Cl.⁶ .......................... H01L 31/058; H02N 6/00
[52] U.S. Cl. .............................................................. 136/253
[58] Field of Search .............................................. 136/253

[56] References Cited

U.S. PATENT DOCUMENTS

| | | | |
|---|---|---|---|
| 4,707,560 | 11/1987 | Hottel et al. | 136/253 |
| 4,776,895 | 10/1988 | Goldstein | 136/253 |
| 4,906,178 | 3/1990 | Goldstein et al. | 431/79 |
| 4,976,606 | 12/1990 | Nelson | 431/79 |
| 5,091,018 | 2/1992 | Fraas et al. | 136/246 |
| 5,096,505 | 3/1992 | Fraas et al. | 136/246 |
| 5,312,521 | 5/1994 | Fraas et al. | 136/253 |
| 5,356,487 | 10/1994 | Goldstein et al. | 136/253 |
| 5,383,976 | 1/1995 | Fraas et al. | 136/253 |
| 5,389,158 | 2/1995 | Fraas et al. | 136/244 |
| 5,439,532 | 8/1995 | Fraas | 136/253 |

OTHER PUBLICATIONS

Fraas, "Heat Exchanger Design . . . ", Wiley–Interscience Publicaiton, pp. 365–382 (USA 1989).
Fraas, "Characteristics of Heat Sources", Engineering Evaluation of Energy Systems, pp. 96–125 McGraw-Hill (USA 1982).
Pelka, "Natural Gas–Fired Thermophotovoltaic System", Proceedings of the 32nd Int'l Power Sources, pp. 110–123 (USA 1986).
Morgan, "Radioisotope Thermal Photovoltaic Application . . . ", NASA Sprat Conference, pp. 349–358 (USA 1989).
Doellner, "Aircraft Photovoltaic Power–Generating System", PhD Thesis University of Arizona (USA 1991) (Appendix 'A').
Fraas, "Design & Development Tests . . . " USAEC Report Conf–651026, (USA 1965), pp. 716–736.
Tester, "Comparative Performance Characteristics . . . ", American Society of Mechanical Engineers, pp. 1–3 (USA 1974).
Fraas, "Effects of Directed and Kinetic Energy Weapons on Spacecraft", Oak Ridge Nat'l Laboratory, pp. 1–76 (USA 1986).
Fraas, "Summary of the Research & Development Effort . . . ", Oak Ridge Nat'l Laboratories, pp. 1—33 (USA 1977).
Howe, "The Characteristics of Atmospheric–Type Burners When used With Natural Gas", Transactions of the A.S.M.E., pp. 673–677 (USA 1940).

(List continued on next page.)

*Primary Examiner*—Aaron Weisstuch
*Attorney, Agent, or Firm*—James Creighton Wray

[57] ABSTRACT

Electric power generator has linear arrays of thermophotovoltaic cells spaced outwardly from a tubular IR emitter. Hot combustion products flow downward from a combustion zone between a central pillar and the IR emitter, and then upward between the emitter and a tubular IR transparent window. The cell arrays are spaced outward from a convection barrier tube and a short pass filter. A burner assembly at the top of the pillar has an alternating arrangement of accelerating air channels with large openings to the air supply and slowing mixing channels with small openings to the air supply. Radial fuel channels connect the central fuel supply with the peripheral mixing channels. Release of accelerated air creates turbulence in the combustion zone where the air and fuel further mix and are ignited. A cavity in the pillar supplies liquid fuels which are atomized by ultrasonic energy from a central rod. The atomized liquids are released through small holes into the combustion zone. Exhaust gases preheat the air supply which is in an upward tubular extension of the IR emitter.

16 Claims, 2 Drawing Sheets

OTHER PUBLICATIONS

Fraas, "Magneto–Hydrodynamic Systems", Engineering Evaluation of Energy Systems, pp. 437–461, McGraw–Hill, Inc., 1982, pp. 437–461.

Day et al., "Application of the GaSb Solar Cell in Isotope–Heated Power Systems", 21st IEEE Photovol. Spec. Conf. Kissimmee, pp. 1320–1325 FL 1990.

Kittl et al., "Design Analysis of TPV–Generator System", Proc. 25th Annual Power Sources Conf., pp. 106–110 (USA 1972).

Woolf, "Optimum Efficiency of Single & Multiple Bandgap Cells . . . ", Solar Cells, 19, pp. 19–20 (USA 1986–1987).

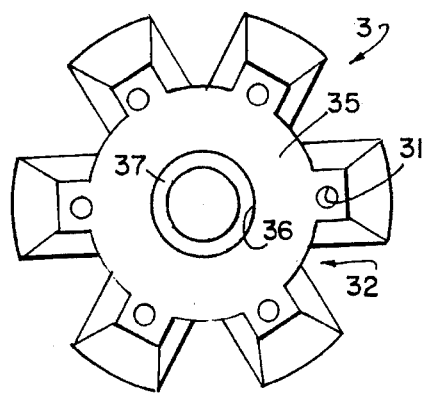
FIG. 3
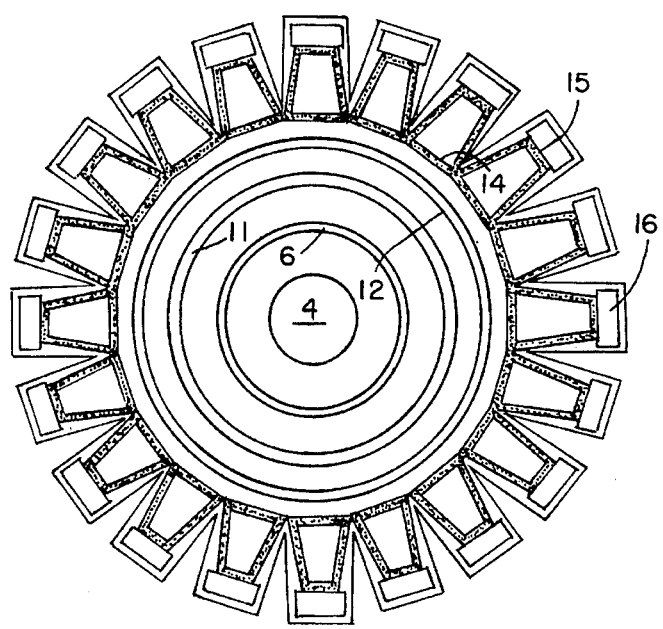
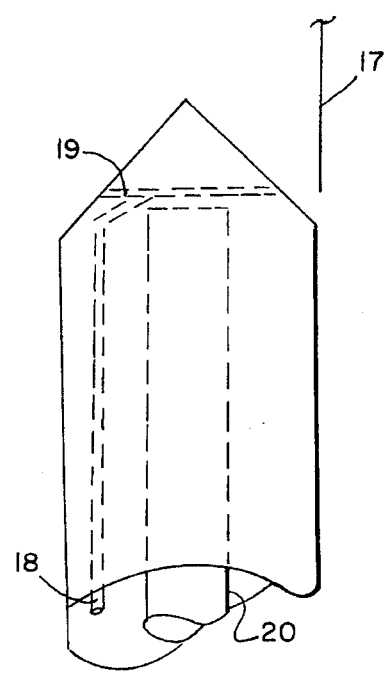
FIG. 5
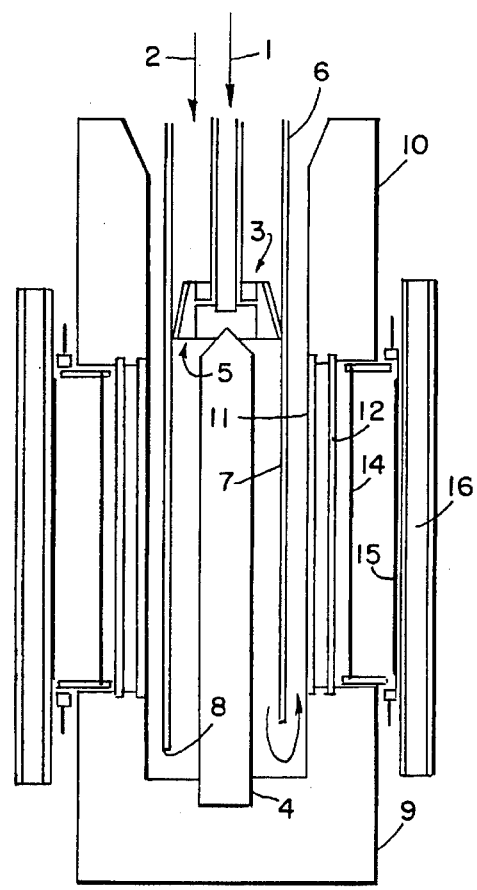
FIG. 4
FIG. 2

GENERATOR WITH THERMOPHOTOVOLTAIC CELLS AND HYDROCARBON BURNER

CROSS-REFERENCE TO RELATED APPLICATIONS

This is a continuation-in-part of patent application Ser. No. 08/260,910 filed Jun. 15, 1994, now U.S. Pat. No. 5,439,532, which was a continuation-in-part of patent application Ser. No. 08/047,477 filed Apr. 19, 1993, now U.S. Pat. No. 5,383,976, and a continuation-in-part of patent application Ser. No. 07/906,452 filed Jun. 30, 1992, now U.S. Pat. No. 5,312,521. These earlier applications and their listed references are incorporated herein by reference.

BACKGROUND OF THE INVENTION

Patent application Ser. No. 08/260,910 filed Jun. 15, 1994 (now U.S. Pat. No. 5,439,532) described air and fuel mixed and burned inside an emitter tube above an infrared (IR) emitter zone. The hot combustion gases then flow downward inside the emitter tube through the IR emitter zone to the emitter tube open bottom end and thence upward again through the IR emitter zone outside the emitter tube heating the emitter uniformly through a double pass. Uniform emitter temperature from the top to the bottom of the IR emitter zone is obtained because the higher heat loss at the upper end in the down pass is counter balanced by lower heat loss at the upper end in the upward pass. Fine tuning of the temperature profile can be obtained by using fins inside and/or outside of the emitter tube and adjusting the fin area as a function of length along the emitter zone.

In the earlier application, the fuel was injected from below in a central tube passing upward through the IR emitter zone. That is acceptable when using natural gas as the fuel. However when hydrocarbon fuels with larger hydrocarbon molecules are used (e.g. propane, butane, kerosene, or gasoline), pyrolysis in the hot zone can occur, resulting in carbon deposits inside the fuel tube. This problem can be avoided by injecting the fuel from above with a fuel tube running down through the center of the counterflow heat exchanger. The counterflow heat exchanger is not shown in FIG. 2 but is as shown in the earlier patent application.

The addition of a mixing nozzle enhances the fuel and air mixing in the combustion zone.

SUMMARY OF THE INVENTION

An electric power generator has linear arrays of thermophotovoltaic cells spaced outwardly from a tubular IR emitter. Hot combustion products flow downward from a combustion zone between a central pillar and the IR emitter, and then upward between the emitter and a tubular IR transparent window. The cell arrays are spaced outward from a convection barrier tube and a short pass filter. A burner assembly at the top of the pillar has an alternating arrangement of accelerating air channels with large openings to the air supply and slowing mixing channels with small openings to the air supply. Radial fuel channels connect the central fuel supply with the peripheral mixing channels. Release of accelerated air creates turbulence in the combustion zone where the air and fuel further mix and are ignited. A cavity in the pillar supplies liquid fuels which are atomized by ultrasonic energy from a central rod. The atomized liquids are released through small holes into the combustion zone. Exhaust gases preheat the air supply which is in an upward tubular extension of the IR emitter.

These and further and other objects and features of the invention are apparent in the disclosure, which includes the above and ongoing written specification, with the claims and the drawings.

BRIEF DESCRIPTION OF THE DRAWINGS

FIG. 2 schematically shows a burner of the present invention in cross-sectional side elevation.

FIG. 3 is a top plan view of the burner shown in FIG. 2.

FIG. 4 shows a start-up arrangement for liquid fuels.

FIG. 5 is a top view of the mixer nozzle assembly.

DETAILED DESCRIPTION OF THE PREFERRED EMBODIMENTS

Figure 1:
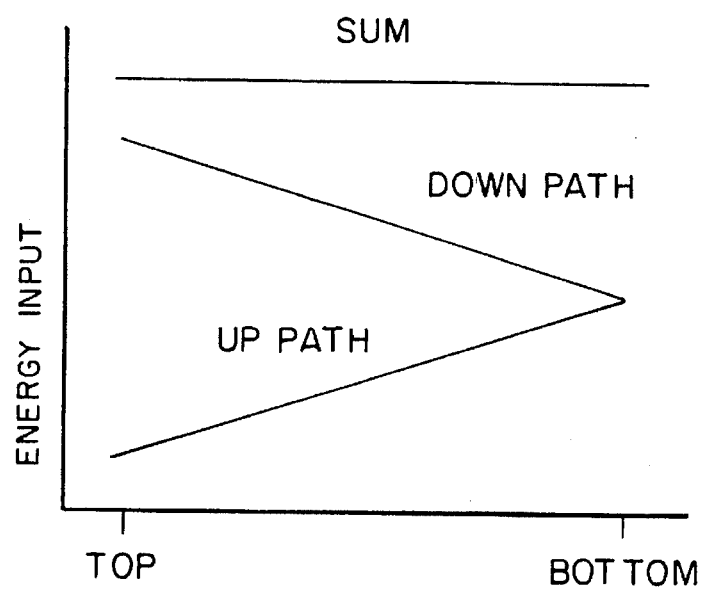
FIG. 1 shows a relationship of energy input and tube position from the prior patent application.

FIG. 1 shows a relationship of energy input and tube position from the parent patent application. In the up path the energy input is high at the bottom and low at the top. In the down path energy input is high at the top and lower at the bottom. The sum of energy input from the up and down paths is substantially constant.

In the present invention, as shown in FIGS. 2 and 3, fuel 1 and preheated air 2 pass downward into a mixer nozzle assembly 3. The mixer nozzle assembly 3 is supported on a central ceramic pillar 4. Combustion occurs in region 5 just below the mixer assembly 3 and inside the infrared (IR) energy emitter tube 6. The hot combustion gases pass downward through the IR emitting section 7 of the emitter tube 6 to the end 8 of the emitter tube, and thence back upward outside the emitter tube, again heating the emitting section 7. The combustion gases are confined in the upward pass on the outside by insulating blocks 9 and 10 and the IR transparent window tube 11. Electric power is generated when IR from the emitting section 7 passes through the window tube 11, the transparent convection barrier tube 12 and the short-pass IR filter 14, and when the IR is absorbed by the TPV cells 15. Excess heat from the cells is removed by liquid flow in the cooling channel 16.

The burner shown in FIGS. 2 and 3 operates without difficulty when using gaseous fuels such as natural gas, propane or butane. However, the use of liquid fuels such as gasoline, diesel or kerosene may present special start-up problems. Once the nozzle assembly 3 has heated up, liquid fuels vaporize and act as gaseous fuels. However, a start-up mode is useful to preheat the nozzle assembly 3 when operating the thermophotovoltaic generation with liquid fuels.

FIG. 4 shows the start-up provisions useful with liquid fuels. As for gaseous fuels, ignition occurs from a spark introduced by the igniter wire 17. However, the liquid fuel is initially introduced from the bottom through a central cavity 18 in the pillar 4. Small radial holes 19 channel fuel from the central cavity to the ignition region. The fuel is atomized upon injection by ultrasonic energy introduced through the center rod 20. Start-up occurs when the atomized liquid droplets burn in the air coming down from inside the emitter tube. The hot exhaust gases then rise outside the emitter tube and preheat the emitter tube, the counterflow heat exchanger, and the nozzle assembly 3. After the preheat cycle, the liquid fuel supply through channel 18 is cut off at the bottom; fuel 2 is introduced at the top and the unit operates in its normal TPV generator mode.

Figure 6:
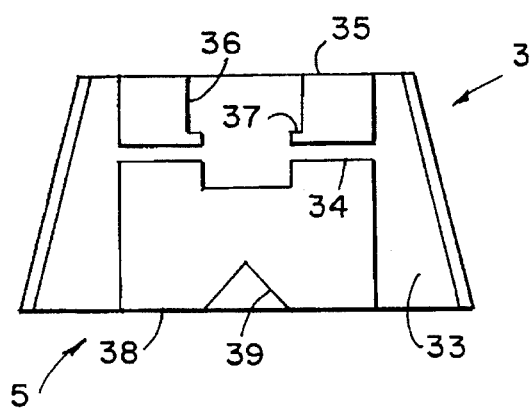
FIG. 6 is a cross-sectional side view of the mixer nozzle assembly.
Figure 7:
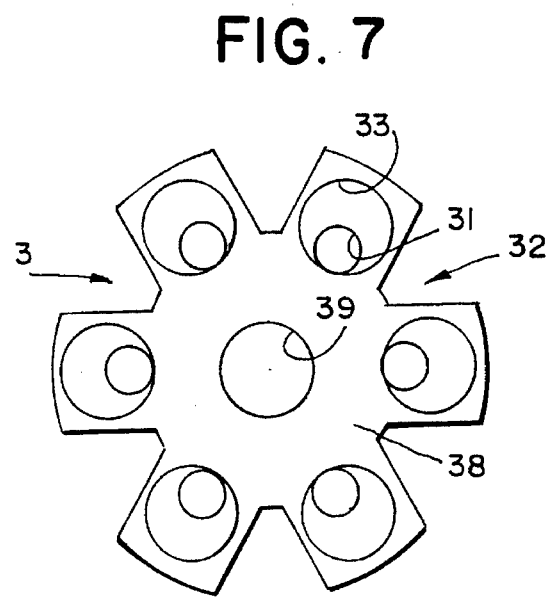
FIG. 7 is a bottom view of the mixer nozzle assembly.

In FIGS. 5, 6, and 7 the mixer nozzle assembly 3 is shown respectively from the top, in a vertical cross-section, and from the bottom. Referring to the top view in FIG. 5, the down flowing air divides and passes either through the small holes 31 or the outer spaces 32. The air that passes through the holes 31 slows down upon expansion as it moves downward in the mixing channels 33. Fuel from channels 34 is first mixed with the slow moving air in the channels 33. The air that passes through the outer spaces 32 is accelerated and becomes turbulent at the lower edge of the mixer element. Stable flames begin in the slow moving air/fuel mixture inside channels 33. Combustion is completed with thorough mixing in the turbulent region 5 below the nozzle assembly.

The top 35 of the nozzle assembly 3 has a central recess 36 which receives the fuel tube shown in FIG. 2. The end of the fuel tube abuts seat 37.

The base 38 of the nozzle assembly 3 has a conical recess 39 to receive the conical tip of pillar 4.

The pillar 4 in FIG. 2 allows both a means of tuning temperature uniformity and a means for increasing the burner size. Tailoring the pillar diameter as a function of length allows the temperature uniformity along the length to be adjusted. Increasing the diameter of the pillar allows a larger emitter diameter and a higher TPV generator power rating.

As an example, in calculating dimensions for a 1 kW generator, assume an upper temperature limited for the SiC emitter of 1500° C. Given that emitter temperature, a typical IR sensitive cell should be able to produce 4 watts per cm2. Given a cell active area of 0.75 cm2, each cell will produce 3 watts. Assuming 20 cells per receiver and 20 receivers arrayed around the burner, the resultant generator will produce 1200 watts. Assuming an emitter circumference equal to 20 times a cell width implied an emitter diameter of (20×0.85 cm×1")/(2.54 cm× 3.14)=2.13". The pillar diameter will then be approximately 1" and the IR emitting zone length will be approximately 8".

While the invention has been described with reference to specific embodiments, modifications and variations of the invention may be constructed without departing from the scope of the invention, which is defined in the following claims.

I claim:

1. A generator comprising thermophotovoltaic cells in an array, an IR generator positioned within the thermophotovoltaic cells array, the IR generator having a tubular IR emitter spaced outward from a central pillar and forming therebetween a first down passage for hot combustion gases, an IR transparent window tube surrounding the IR emitter forming therebetween an up passage for the hot combustion gases which heat the IR emitter, a fuel supply tube, an air supply surrounding the fuel tube, a hydrocarbon burner assembly positioned above the pillar in the air supply tube for generating the hot combustion gases, the burner assembly further comprising air channels for directing air to a combustion zone below the burner assembly and mixing channels connected to the fuel supply and to the air supply for mixing fuel and air and supplying a fuel-air mixture to the combustion zone, and an igniter in the combustion zone for combusting the fuel-air mixture and creating the hot combustion gases for heating the IR emitter.

2. The apparatus of claim 1, wherein the air channels have convergent walls for accelerating the air and creating turbulence in the combustion zone, and wherein the mixing channels have small air inlets and divergent walls for slowing the air-fuel mixture supplied to the combustion zone.

3. The apparatus of claim 2, wherein the air channels and the mixing channels are interposed.

4. The apparatus of claim 3, wherein the convergent walls of the air channels form the divergent walls of the mixing channels.

5. The apparatus of claim 4, wherein the air channels and the mixing channels are arranged annularly around a void in the burner assembly forming an annular shape of the combustion zone.

6. The apparatus of claim 1, wherein the central pillar supports the burner nozzle assembly.

7. The apparatus of claim 1, wherein the air supply comprises a tubular extension of the IR emitter, and wherein the fuel supply comprises a tube centered within the extension for preheating the air.

8. The apparatus of claim 1, further comprising a starter fuel supply cavity extending in the pillar, and holes in a top of the pillar connected to the cavity for supplying fuel therefrom to the combustion zone.

9. The apparatus of claim 8, further comprising a rod in the pillar adjacent the cavity for ultrasonic atomizing of liquid fuel in the cavity.

10. A generator comprising thermophotovoltaic cells in an array and a hydrocarbon burner apparatus, with said hydrocarbon burner apparatus comprising a body having first and second opposite surfaces, a first air side surface and a second opposite combustion zone surface, and having outer surfaces connected to an air supply, a fuel supply connected to air channels in said body and air-fuel mixing channels alternating in peripheral annular arrangement in the body and fuel channels within the body leading from the fuel supply to the air-fuel mixing channels and supplying a fuel and air mixture to the combustion zone, and for separately supplying air from the air channels to a combustion zone and an igniter in the combustion zone.

11. The apparatus of claim 10, wherein the air channels have convergent walls for accelerating the air and creating turbulence in the combustion zone, and wherein the mixing channels have small air inlets and divergent walls for slowing the air-fuel mixture supplied to the combustion zone.

12. The apparatus of claim 11, wherein the convergent walls of the air channels form the divergent walls of the mixing channels.

13. The apparatus of claim 12, wherein the air channels and the mixing channels are arranged annularly around a void in the burner assembly forming an annular shape of the combustion zone.

14. The apparatus of claim 10, further comprising a central pillar for supporting the body.

15. The apparatus of claim 14, further comprising a starter fuel supply cavity extending in the pillar, and holes in a top of the pillar connected to the cavity for supplying fuel therefrom to the combustion zone.

16. The apparatus of claim 15, further comprising a rod in the pillar adjacent the cavity for ultrasonic atomizing of liquid fuel in the cavity.

\* \* \* \* \*